United States Patent
Yew et al.

(10) Patent No.: US 6,251,769 B1
(45) Date of Patent: Jun. 26, 2001

(54) METHOD OF MANUFACTURING CONTACT PAD

(75) Inventors: Tri-Rung Yew, Hsinchu Hsien; Kuo-Tai Huang, Hsinchu; Water Lur, Taipei, all of (TW)

(73) Assignee: United Microelectronics Corp, Hsinchu (TW)

( * ) Notice: Subject to any disclaimer, the term of this patent is extended or adjusted under 35 U.S.C. 154(b) by 0 days.

(21) Appl. No.: 09/347,180

(22) Filed: Jul. 2, 1999

(51) Int. Cl.[7] ............................................... H01L 21/4763
(52) U.S. Cl. ..................... 438/618; 438/481; 438/6.54; 438/607
(58) Field of Search ..................... 438/618, 607, 438/481, 654, 299, 364, 413, 416, 429

(56) References Cited

U.S. PATENT DOCUMENTS 4,745,081 * 5/1988 Beyer et al. ........................ 438/481

* cited by examiner

Primary Examiner—Charles Bowers
Assistant Examiner—Yennhu B. Huynh

(57) ABSTRACT

A method of manufacturing a contact pad. A substrate having a source/drain region formed therein is provided. A dielectric layer is formed over the substrate. An opening is formed in the dielectric layer and exposes the source/drain region. A selective epitaxial process is performed to form a contact pad in the opening, wherein a top of the contact pad extends onto a surface of the dielectric layer.

23 Claims, 4 Drawing Sheets

METHOD OF MANUFACTURING CONTACT PAD

BACKGROUND OF THE INVENTION

1. Field of Invention

The present invention relates to a method of manufacturing a semiconductor device. More particularly, the present invention relates to a method of manufacturing a contact pad.

2. Description of Related Art

Currently, the aspect ratio of a node contact hole and a contact hole is increased as the integration of the integrated circuit is increased, so that it is difficult to open the node contact hole and the contact hole in a photolithography and etching process. Hence, a contact pad formed on a source/drain region is used as a contact medium between the source/drain region and a node contact (or a contact) to overcome the problem of opening the node contact hole or the contact hole.

FIGS. 1A through 1D are schematic, cross-sectional views of the conventional process for manufacturing a node contact hole.

As shown in FIG. 1A, a substrate 100 having a shallow trench isolation (STI) 102, a source/drain region 104, a gate structure 106 and an inter-layer dielectric (ILD) layer 108 is provided. The STI 102 is formed in the substrate 100. The gate structure 106 is formed on the substrate 100 and the source/drain regions 104 are formed in the substrate 100 exposed by the gate structure 106. The ILD layer 108 is formed over the substrate 100. An opening 110 is formed in the ILD layer 108 and exposes a portion of the source/drain region 104. A polysilicon layer 112 is formed over the substrate 100 and fills the opening 110.

As shown in FIG. 1B, a portion of the polysilicon layer 112 is removed by chemical-mechanical polishing (CMP) or etching back to expose the surface of the ILD layer 108. The remaining polysilicon layer 112 forms a contact pad 112a. An interpoly dielectric layer (IPD) 114 is formed over the substrate 100.

As shown in FIG. 1C, a bit-line opening 116 is formed to penetrate through the IPD layer 114 and the ILD layer 108 and exposes a portion of the source/drain region 104. A polysilicon layer (not shown) is formed over the substrate 100 and fills the bit-line opening 116. The polysilicon layer is patterned to form a bit line 116a in the bit-line opening 116.

As shown in FIG. 1D, a dielectric layer 118 is formed over the substrate 100. A node contact hole 120 aligned with the contact pad 112a is formed to penetrate through the dielectric layer 118 and the IPD layer 114 and exposes the contact pad 112a.

While the node contact hole is formed, misalignment may occur, as shown in FIG. 2. In FIG. 2, an opening formed when misalignment occurs is denoted by 222, while the reference numbers of the other components are the same as that in FIG. 1D since the manufacturing procedure of those components are the same as that illustrated by FIG. 1D. Because the opening 222 merely exposes a portion of the contact pad 112, the contact area between the contact pad 112 and the subsequently formed node contact is relatively small. Hence, the contact resistance between the contact pad 112 and the subsequently formed node contact is increased. Additionally, the materials of the dielectric layer 118, the IPD layer 114 and ILD layer 108 are similar to each other, so the etching depth cannot be easily controlled and the opening 222 easily penetrates through the IPD layer 114 and into the ILD 108 to form a trench 222a adjacent to the contact pad 112a. Moreover, in the subsequent formation of the node contact in the node contact hole, it is difficult to fill the trench 222a with polysilicon material, so that a void is formed in the trench 222a. These conditions lead to electrical failure of the device. Typically, in order to overcome the problem caused by the misalignment of the node contact hole, the size of the node contact hole is decreased to avoid the formation of the node contact hole from misalignment. However, the contact area between the contact pad and the subsequently formed node contact is decreased due to the decreasing of the size of the node contact hole, so that contact resistance is increased.

SUMMARY OF THE INVENTION

The invention provides an improved method of manufacturing a contact pad. A substrate having a source/drain region formed therein is provided. A dielectric layer is formed over the substrate. An opening is formed in the dielectric layer and exposes the source/drain region. A selective epitaxial process is performed to form a contact pad in the opening, wherein a top of the contact pad extends onto a surface of the dielectric layer. A gas source of the selective epitaxial process includes $Si_xH_y$/HCl or $Si_xH_yCl_z$/HCl. While the selective epitaxial process is performed, an in situ doping process is simultaneously performed by adding doping gases ($PH_3$ or $AsH_3$ etc.).

The invention provides a method of manufacturing a semiconductor device. A substrate having a gate structure formed thereon and a source/drain region formed therein under the gate structure is provided. A first dielectric layer is formed over the substrate. An opening is formed in the first dielectric layer to expose the source/drain region. A selective epitaxial process is performed to form a contact pad in the opening, wherein a top of the contact pad extends onto a surface of the first dielectric layer. A second dielectric layer is formed over the substrate. A node contact hole is formed in the second dielectric layer to expose the contact pad.

Since the top of the contact pad extends onto the surface of the first dielectric layer to form a T shaped contact pad, the area of the top of the contact pad is relatively large. Therefore, the contact resistance is not increased. Additionally, etching rates of the contact pad and the first dielectric layer are different, the etching stopped on the contact pad can be well controlled while misalignment occurs. Moreover, the contact pad is formed by a selective epitaxial process, so that the cost is decreased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serves to explain the principles of the invention. In the drawings.

DESCRIPTION OF THE PREFERRED EMBODIMENTS

Figure 3A:
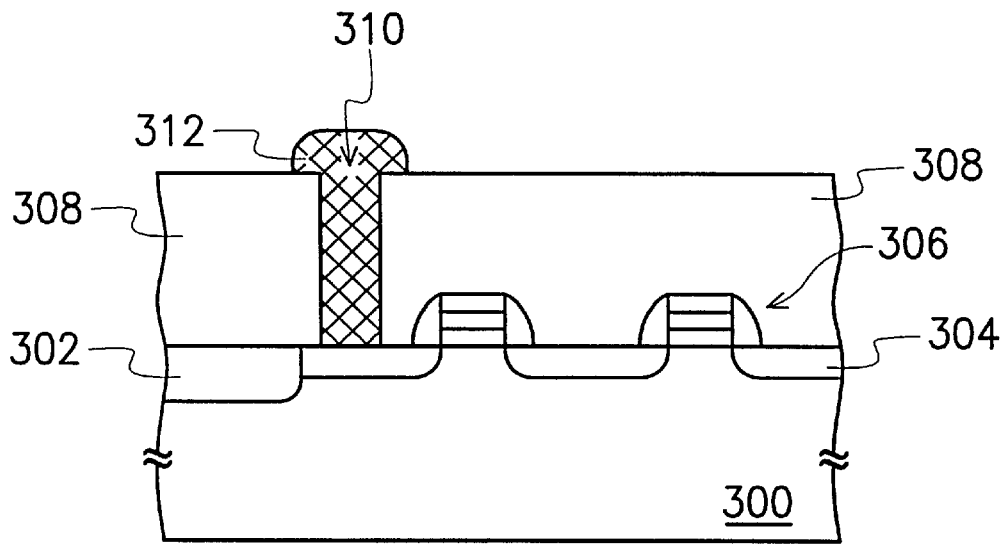
FIGS. 3A through 3C are schematic, cross-sectional views of the process for manufacturing a node contact hole in a dynamic random access memory in a preferred embodiment according to the invention.
Figure 3B:
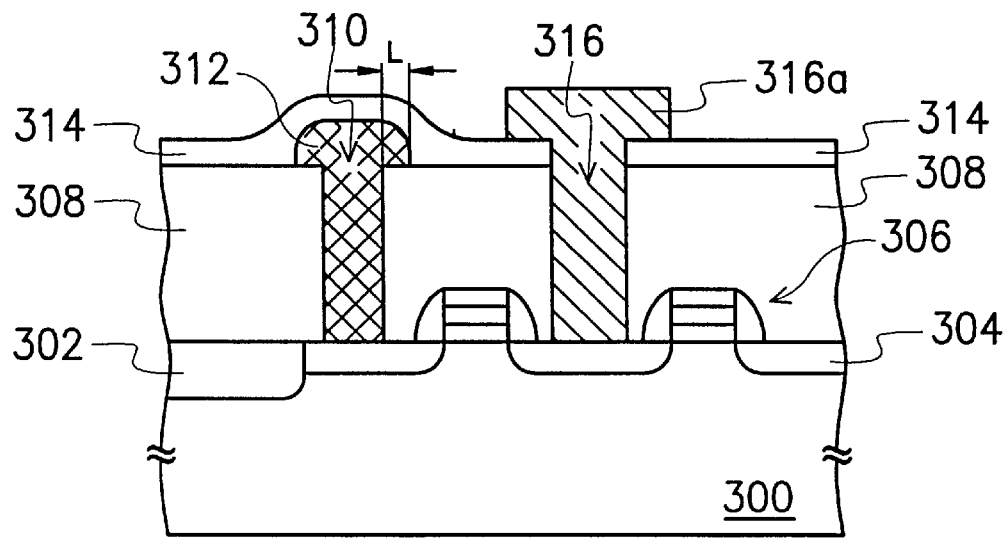
Figure 3C:
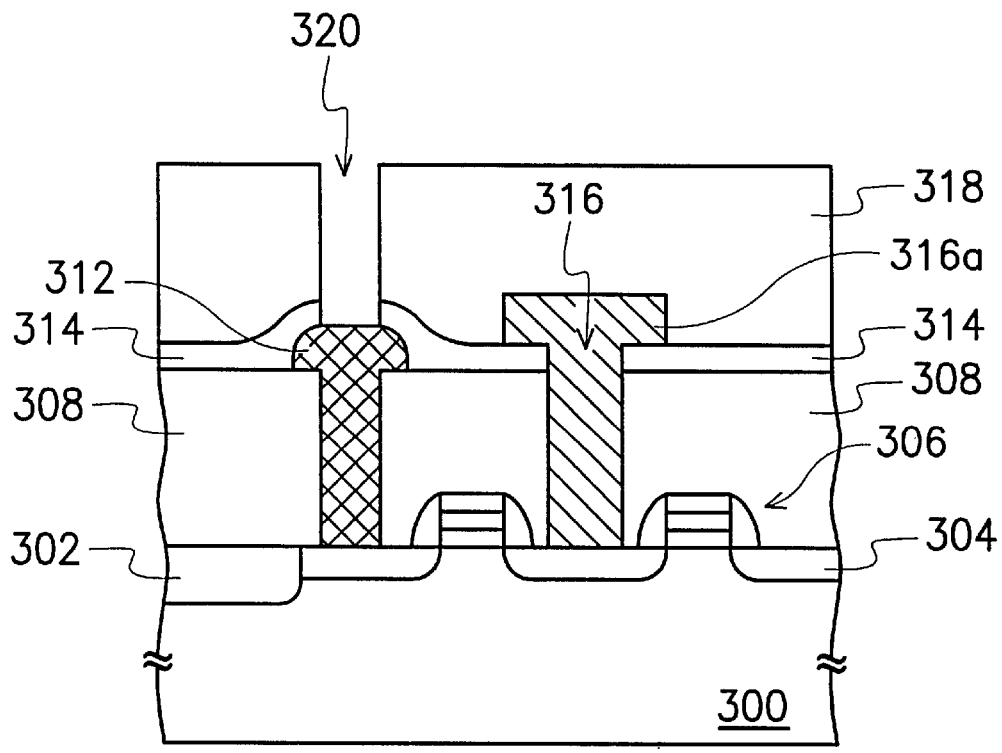

FIGS. 3A through 3C are schematic, cross-sectional views of the process for manufacturing a node contact hole in a dynamic random access memory in a preferred embodiment according to the invention.

Figure 1A:
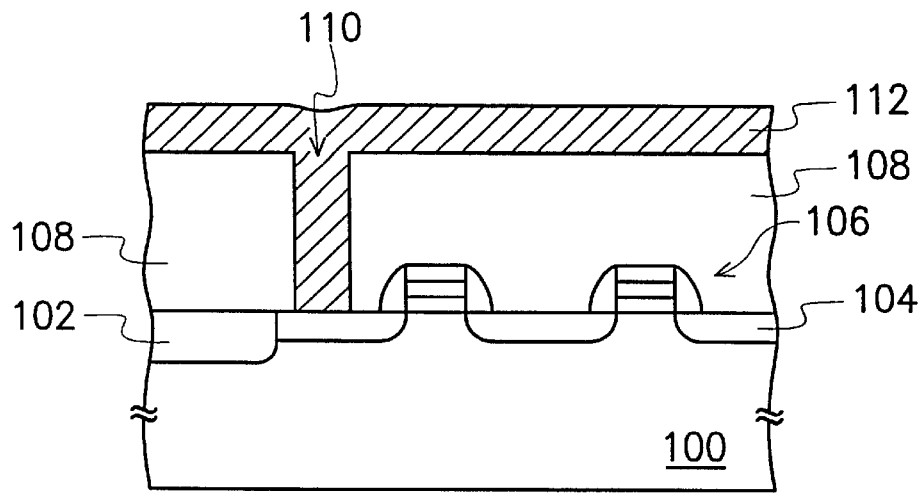
FIGS. 1A through 1D are schematic, cross-sectional views of the conventional process for manufacturing a node contact hole.
Figure 1B:
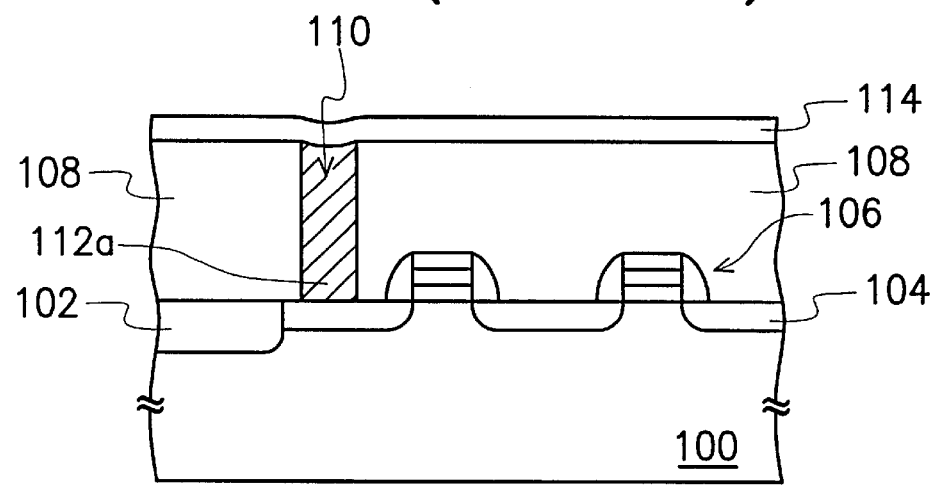
Figure 1C:
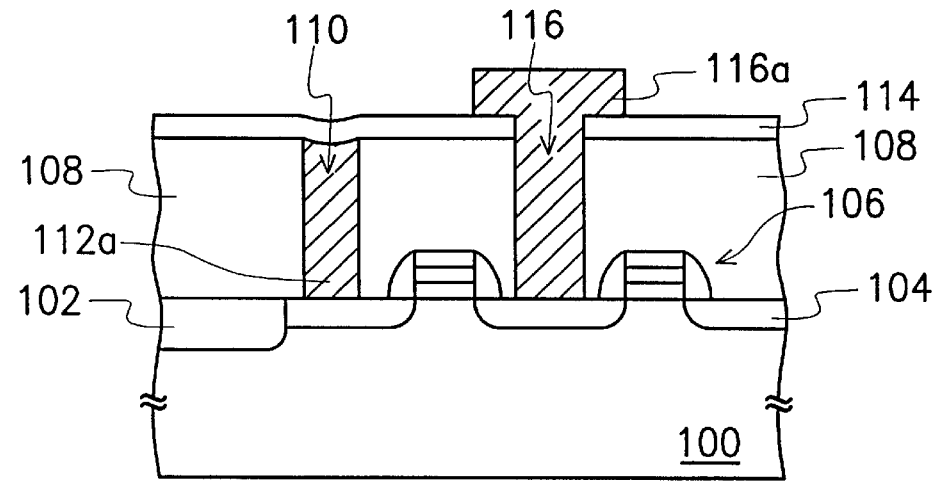
Figure 1D:
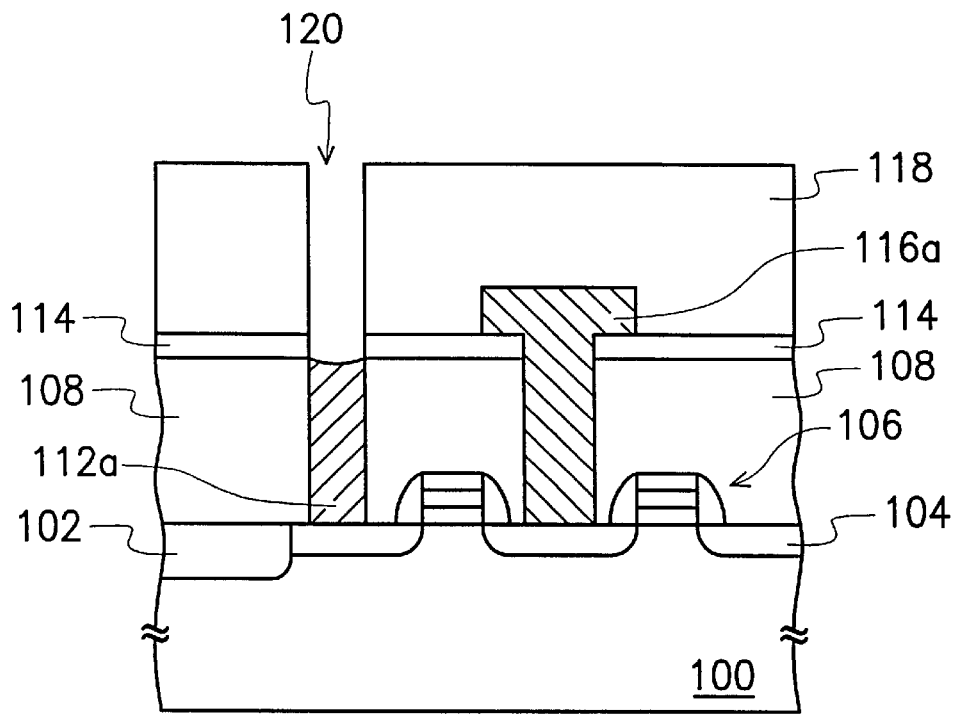
Figure 2:
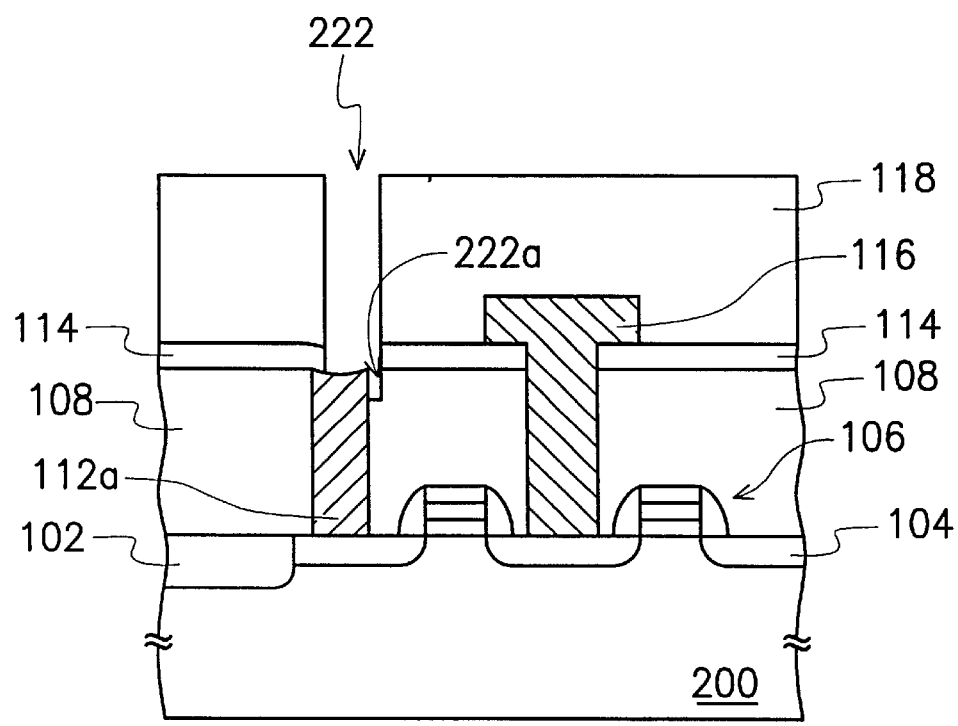
FIG. 2 is schematic, cross-sectional views of a conventional node contact hole when misalignment occurs.

As shown in FIG. 3A, a substrate 300 having a shallow trench isolation (STI) 302, a source/drain region 304, a gate structure 306 and a dielectric layer 308 is provided. The STI 302 is formed in the substrate 300. The gate structure 306 is formed on the substrate 300 and the source/drain regions 304 are formed in the substrate 300 exposed by the gate structure 306. The dielectric layer 308 is formed over the substrate 300. The dielectric layer 308 can be formed from silicon oxide by chemical vapor deposition (CVD), for example. An opening 310 is formed in the dielectric layer 308 and exposes a portion of the source/drain region 304. A contact pad 312 is formed in the opening 310 and the top of the contact pad extends onto the surface of the dielectric layer 308. The material of the contact pad 312 can be polysilicon, for example. The method of forming the contact pad 312 comprises the steps of performing an in situ cleaning process such as an in situ plasma cleaning process to remove a native oxide layer (not shown) and impurities (not shown). The gas source for the in situ plasma cleaning process can be $H_2$, $He/H_2$ or $Ar/H_2$, for example. Then, a selective epitaxial process is performed with a gas source such as $Si_xH_y/HCl$ or $Si_xH_yCl_z/HCl$ to form epitaxial silicon (not shown) on the surface of the substrate 300 exposed by the opening 310 until the epitaxial silicon fills the opening 310. After the opening 310 is filled by the epitaxial silicon, lateral growth is induced to form a T shaped contact pad 312 having a top extending onto the surface of the dielectric layer 308. A distance L between the edge of the opening 310 and that of the top of the contact pad 312 can be varied according to the process margin or the requirement of the manufacturing process condition by controlling the duration for lateral growing. Since the top of the contact pad 312 extends onto the surface of the dielectric layer 308, the area of the top of the contact pad 312 is larger than that of the conventional contact pad 112a (as shown in FIG. 1D). Moreover, the distance L can be adjusted with the process margin or the requirement of the manufacturing process condition. Hence, the subsequently formed node contact hole can be self-aligned with the contact pad 312 and the problem due to misalignment can be overcome. Furthermore, it is unnecessary to shrink the size of the node contact hole to avoid the misalignment, so the contact resistance is not increased. Incidentally, since the contact pad 312 is formed to fill the opening 310 by a selective epitaxial process, it is unnecessary to perform CMP. Therefore, the cost is decreased. Additionally, during the performance of the selective epitaxial process, an in situ doping process is performed by adding doping gases ($PH_3$ or $AsH_3$ etc.) to increase the conductivity of the contact pad 312.

As shown in FIG. 3B, a dielectric layer 314 is formed over the substrate 300. The dielectric layer 314 can be formed from silicon oxide by CVD. A bit-line opening 316 is formed to penetrate through the dielectric layers 314 and 308 and to expose a portion of the source/drain region 304. A conductive layer (not shown) is formed on the dielectric layer 314 and fills the bit-line opening 316. The conductive layer is patterned to form a bit line 316a in the bit-line opening 316. The bit line 316a can be made of polysilicon, for example.

As shown in FIG. 3C, a dielectric layer 318 is formed over the substrate 300. The dielectric layer 318 can be formed from silicon oxide by CVD, for example. A node contact hole 320 is formed to penetrate the dielectric layers 318 and 314 and exposes a portion of the top of the contact pad 312.

Figure 4:
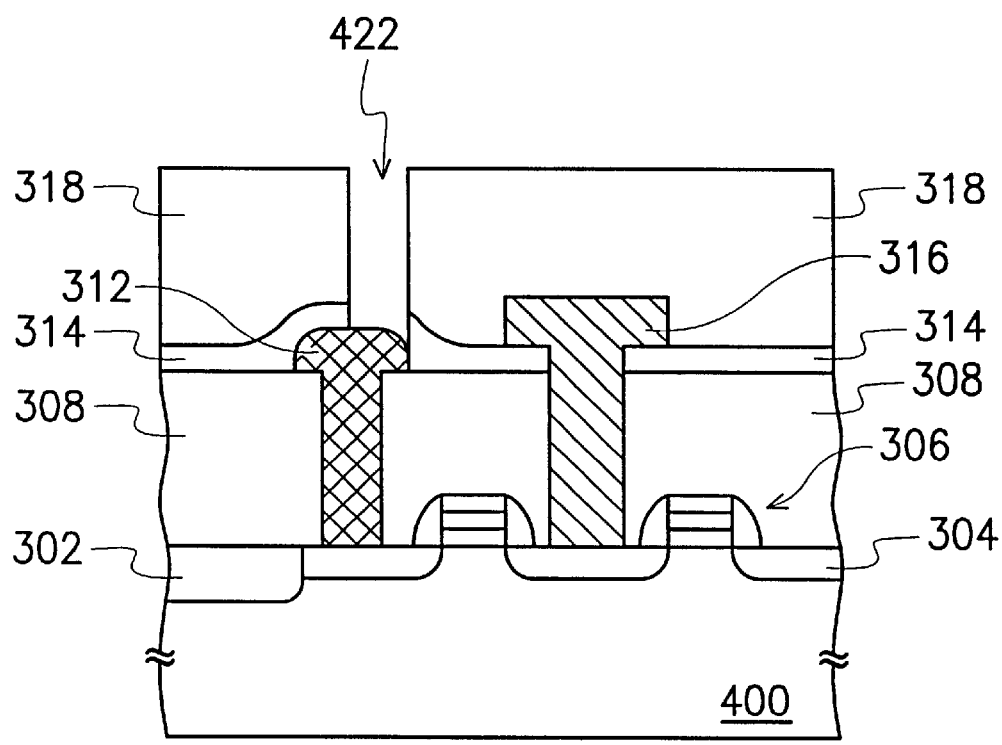
FIG. 4 is schematic, cross-sectional view of a node contact hole when misalignment occurs according to one preferred embodiment of this invention.

As shown in FIG. 4, during node contact hole formation, misalignment occurs. In FIG. 4, an opening formed as the misalignment occurs is denoted by 422, while the reference numbers for the other components are the same as that in FIG. 3C since the manufacturing procedure for those components is the same as that in FIG. 3C. Since the contact pad 312 is a T shaped contact pad, that is, the top of the contact pad extending onto the surface of the dielectric layer 318, the area of the top of the contact pad 312 is relatively large. Additionally, the distance L between the edge of the opening 310 and that of the top of the contact pad 312 can be adjusted according to the process margin or the requirement of the manufacturing process condition. Therefore, the area of the contact pad 312 exposed by the node contact hole 422 is not decreased even though the misalignment occurs. Hence, the contact resistance is not increased. Incidentally, because the etching rate of the contact pad 312 is different from that of the dielectric layer 318, the contact pad 312 is used as an etching stop point during the formation of the node contact hole 422. Therefore, the etching stop moment can be well controlled. Hence, the electrical problem of the subsequently formed device due to the node contact hole penetrating through the dielectric layer to form a trench adjacent to the contact pad when misalignment occurs can be overcome.

In the embodiment of the invention, the formation of the node contact hole of the dynamic random access memory is taking as an example. In application, the invention can be also used to form a contact hole.

Altogether, the invention has following advantages:

1. In the invention, the top of the contact pad 312 extends onto the surface of the dielectric layer 308 to form a T shaped contact pad, so that the area of the top of the contact pad 312 is relatively large. Moreover, the distance L between the edge of the opening 310 and that of the top of the contact pad 312 can be adjusted with the process margin or the requirement of the manufacturing process condition. Therefore, the area of the contact pad 312 exposed by the node contact hole 422 is not decreased even though misalignment occurs. Hence, the contact resistance is not increased.

2. In the invention, because of the lateral growth of the top of the contact pad 312 and the difference between the etching rates of the contact pad 312 and the dielectric layer 308, the etching stop moment can be precisely controlled when misalignment occurs.

3. In the invention, the contact pad is formed by a selective epitaxial process, so that it is unnecessary to perform CMP after the contact pad is formed. Therefore, the cost is decreased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a contact pad, comprising the steps of:

providing a substrate having a source/drain region formed therein;

forming a dielectric layer over the substrate;

forming an opening in the dielectric layer to expose the source/drain region; and performing a selective epitaxial process to form a T-shaped contact pad in the opening, wherein a top of the contact pad laterally extends over a surface of the dielectric layer.

2. The method of claim 1, further comprising, before the step of performing the selective epitaxial process, a step of performing an in situ cleaning process.

3. The method of claim 2, wherein the in situ cleaning process includes an in situ plasma cleaning process.

4. The method of claim 3, wherein a gas source of the in situ plasma cleaning process includes $H_2$.

5. The method of claim 3, wherein a gas source of the in situ plasma cleaning process includes He and $H_2$.

6. The method of claim 3, wherein a gas source of the in situ plasma cleaning process includes Ar and $H_2$.

7. The method of claim 1, further comprising a step of performing an in situ doping process during the step of performing the selective epitaxial process.

8. The method of claim 1, wherein a gas source of the selective epitaxial process includes $Si_xH_y$ and HCl.

9. The method of claim 1, wherein a gas source of the selective epitaxial process includes $Si_xH_yCl_z$ and HCl.

10. A method of manufacturing a semiconductor device formed on a substrate, the substrate having a gate structure formed thereon and a source/drain region formed therein under the gate structure, the method comprising the steps of:

forming a first dielectric layer over the substrate;

forming an opening in the first dielectric layer to expose the source/drain region;

performing a selective epitaxial process to fill the opening with a contact pad until a top of the contact pad laterally extends over a surface of the first dielectric layer to form a contact pad;

forming a second dielectric layer over the substrate; and forming a node contact hole in the second dielectric layer to expose the contact pad.

11. The method of claim 10, wherein before the step of performing the selective epitaxial process, further comprises a step of performing an in situ cleaning process.

12. The method of claim 11, wherein the in situ cleaning process includes an in situ plasma cleaning process.

13. The method of claim 12, wherein a gas source of the in situ plasma cleaning process includes $H_2$.

14. The method of claim 12, wherein a gas source of the in situ plasma cleaning process includes He and $H_2$.

15. The method of claim 12, wherein a gas source of the in situ plasma cleaning process includes Ar and $H_2$.

16. The method of claim 10, further comprising a step of performing an in situ doping process during the step of performing the selective epitaxial process.

17. The method of claim 10, wherein a gas source of the selective epitaxial process includes $Si_xH_y$ and HCl.

18. The method of claim 10, wherein a gas source of the selective epitaxial process includes $Si_xH_yCl_z$ and HCl.

19. A method of manufacturing a semiconductor device formed on a substrate, the substrate having a gate structure formed thereon and a source/drain region formed therein under the gate structure, the method comprising the steps of:

forming a first dielectric layer over the substrate;

forming an opening in the first dielectric layer to expose the source/drain region;

performing an in situ cleaning process;

performing a selective epitaxial process to fill the opening with a contact pad until a top of the contact pad laterally extends over a surface of the first dielectric layer to form a contact pad;

forming a second dielectric layer over the substrate; and forming a node contact hole in the second dielectric layer to expose the contact pad.

20. The method of claim 19, wherein a gas source of the in situ plasma cleaning process includes He and $H_2$.

21. The method of claim 19, wherein a gas source of the in situ plasma cleaning process includes Ar and $H_2$.

22. The method of claim 19, wherein a gas source of the selective epitaxial process includes $Si_xH_y$ and HCl.

23. The method of claim 19, wherein a gas source of the selective epitaxial process includes $Si_xH_yCl_z$ and HCl.

* * * * *